United States Patent
Fink et al.

(10) Patent No.: US 10,340,911 B2
(45) Date of Patent: Jul. 2, 2019

(54) METHOD FOR PROGRAMMING A TWO-WIRE SENSOR AND PROGRAMMABLE TWO-WIRE SENSOR

(71) Applicant: TDK-Micronas GmbH, Freibrug (DE)

(72) Inventors: Hans-Jörg Fink, Freiburg (DE); Tomas Kauter, Freiburg (DE)

(73) Assignee: TDK - Micronas GmbH, Freiburg (DE)

( * ) Notice: Subject to any disclaimer, the term of this patent is extended or adjusted under 35 U.S.C. 154(b) by 0 days.

(21) Appl. No.: 16/107,405

(22) Filed: Aug. 21, 2018

(65) Prior Publication Data

US 2019/0068184 A1    Feb. 28, 2019

(51) Int. Cl.
*H03K 17/18* (2006.01)
*G08C 19/22* (2006.01)
*G01R 19/165* (2006.01)

(52) U.S. Cl.
CPC ....... *H03K 17/18* (2013.01); *G01R 19/16585* (2013.01); *G08C 19/22* (2013.01)

(58) Field of Classification Search
CPC ... H03K 17/18; G01R 19/16585; G08C 19/22
USPC ........................................ 340/517
See application file for complete search history.

(56) References Cited

U.S. PATENT DOCUMENTS

| 5,488,307 | A | * | 1/1996 | Plott | G01D 18/00 324/555 |
| 5,790,046 | A | | 8/1998 | Blossfeld | |
| 6,437,581 | B1 | | 8/2002 | Blossfeld | |
| 6,473,710 | B1 | * | 10/2002 | Eryurek | G08C 19/02 374/183 |
| 7,430,259 | B2 | | 9/2008 | North et al. | |
| 8,330,528 | B2 | * | 12/2012 | Eckrich | G01D 5/24452 327/530 |
| 2002/0153885 | A1 | | 10/2002 | Blossfeld | |
| 2003/0052657 | A1 | | 3/2003 | Koernle et al. | |
| 2009/0086831 | A1 | | 4/2009 | Punyko et al. | |

FOREIGN PATENT DOCUMENTS

| DE | 199 19 084 A1 | 11/2000 |
| DE | 101 19 471 A1 | 10/2002 |
| DE | 101 46 204 A1 | 4/2003 |
| EP | 0 690 290 A1 | 6/1995 |

* cited by examiner

*Primary Examiner* — John A Tweel, Jr.
(74) *Attorney, Agent, or Firm* — 24IP Law Group USA, PLLC; Timothy Dewitt

(57) ABSTRACT

A method for programming a two-wire sensor having at least two sensor units. The method comprises the following steps of: switching on the at least two sensor units, activating one of the at least two sensor units, capturing operating states of the at least two sensor units; detecting an operating state in which one individual sensor unit is active; and sending a programming command to the detected active sensor unit.

10 Claims, 2 Drawing Sheets

Sensor 20a

Sensor 20b

METHOD FOR PROGRAMMING A TWO-WIRE SENSOR AND PROGRAMMABLE TWO-WIRE SENSOR

CROSS REFERENCE TO OTHER APPLICATIONS

This application claims the priority of and benefit to German Patent Application filed on 25 Aug. 2017 entitled DE 10 2017 119 575.0. The entire content of the aforementioned application is incorporated herein by reference.

BACKGROUND OF THE INVENTION

Field of the Invention

The application relates to a method for programming a two-wire sensor and a two-wire sensor programmable in this manner.

Brief Description of the Related Art

Two-wire sensors are constructed from at least one sensor unit and electronic components for processing the signals delivered by the sensor unit. The sensor unit comprises a circuit which can be programmed. The sensor unit measures physical quantities such as temperature, pressure or the field strength of a magnetic field, for example. The sensor units can therefore be pressure sensors, Hall sensors, optoelectronic sensors, etc. Both the current supply and the forwarding of the measured and processed measuring signals take place over only two lines. Therefore the two-wire sensor has only two connectors, which simultaneously serve for the current supply and the forwarding of the measured and processed measuring signals. These two connectors have to be used also for the programming of the two-wire sensor, but they cannot address or switch on or off the programmable circuits directly.

Two-wire sensors are executed i.e. as contactless mechanical switches, which, in dependence on the strength and the direction of a magnetic field to be measured, deliver e.g. a current of different intensity as measuring signals. Such two-wire sensors are used for example in motor vehicles as position switches (brake pedal, accelerator pedal, etc.).

Such two-wire sensors are known for example from the German patent application No. DE 101 19 471 A1 of the company Micronas GmbH from Freiburg. This patent application describes a measuring sensor, also referred to as sensor unit, which delivers pulse-width modulated signals (PWM). The pulse width of the measuring signals produced by the two-wire sensor depends on the magnitude of the measuring signals to be measured.

From the German patent application No. 101 46 204 A1 a circuit arrangement is known for the voltage supply of a two-wire sensor. The two-wire sensor is connected to the one pole of a supply voltage source via a first connecting line in which a current limiting resistor is disposed, and to the other pole via a second connecting line. At least one limiting diode is disposed in parallel to the two-wire sensor and the current limiting resistor. This limiting diode protects the two-wire sensor against excessively high current which leads to overheating and a possible explosion of the two-wire sensor.

A sensor with a programmable signal threshold and a method for programming the signal threshold of the sensor is known for example from EP 0 690 290 A1.

For reasons of reliability, two-wire sensors are constructed pairwise in modules. The two sensor units are connected in parallel and are to be calibrated or programmed in the module separately from one another. For a sensor with three wires, this programming does not pose a problem, since a further connector or pin is available, and the sensor units can be addressed or switched on and off therethrough. In contrast, in a two-wire sensor only the supply lines for Vdd and Vss are present.

SUMMARY OF THE INVENTION

The object of the invention is therefore to develop a method which allows for the programming of the circuits in the sensor units of a two-wire sensor.

This object is achieved by a method for programming a two-wire sensor having at least two sensor units which comprises the following steps of: Switching on the at least two sensor units, activating one of the at least two sensor units, capturing operating states of the at least two sensor units; detecting an operating state in which one individual sensor unit is active; and sensing a programming command to the detected active sensor unit.

In one aspect of the method the activation is caused by different clock frequencies on the sensor units. These different clock frequencies are produced by a random generator.

The operating state of a sensor unit is captured by measuring a current consumption or by detecting a current pulse. After detection of an active sensor unit the active sensor unit is programmed, since the active sensor unit is ready to receive programming commands.

Subsequently the programmed sensor unit is deactivated or switched off and the not yet programmed sensor unit is programmed.

This object is also achieved by a two-wire sensor comprising a first supply line and a second supply line, and at least two sensor units which are arranged and connected in parallel between the first supply line (Vdd) and the second supply line (Vss). The two-wire sensor also comprises a programming logic which carries out the method.

BRIEF DESCRIPTION OF THE DRAWINGS

Further properties and advantages of the invention will result from the following, purely illustrative and in no way limiting description of preferred embodiments and reference made to the following drawings. There are shown.

DETAILED DESCRIPTION OF THE INVENTION

Figure 1:
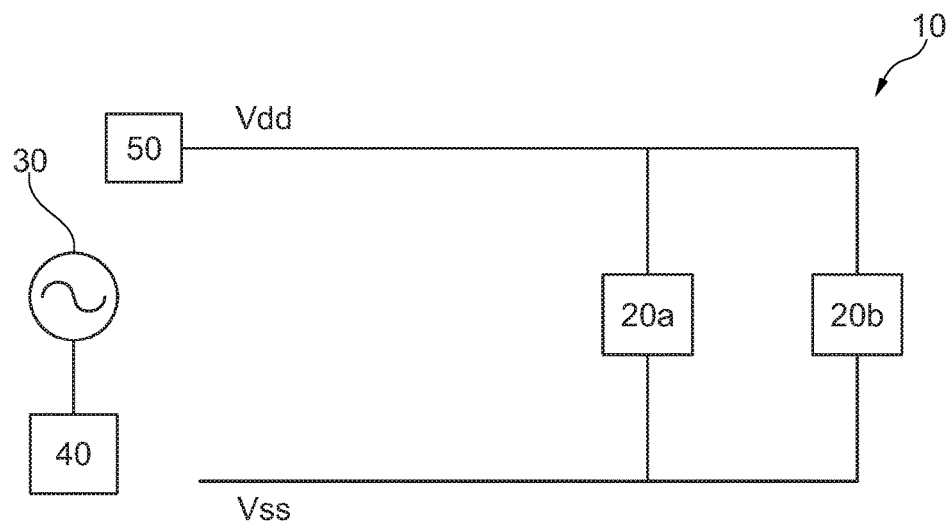
FIG. 1 a module for a two-wire sensor.

FIG. 1 shows a two-wire sensor 10 with two sensor units 20a and 20b which are connected respectively to supply lines Vdd and Vss. The circuits of the sensor units 20a and 20b are indistinguishable from one another and are to be programmed differently. The two-wire sensor 10 is likewise equipped with a clock generator 30 for producing a pulse signal. The clock generator 30 is connected to a random generator 40 which changes the clock rate. The supply lines Vdd and Vss are in addition connected to a programming logic 50 which produces programming requests or commands and sends these to the circuits in the sensor units 20a and 20b in order to be able to (re-)program these sensor units 20a and 20b. The programming commands for reprogramming the circuits are transferred to the sensor units 20a and 20b via the supply lines Vdd and Vss. Each circuit has to be programmed separately. However, there is no possibility of addressing or switching on and off the circuits directly and separately from one another respectively via the supply lines Vss and Vdd.

Figure 2:
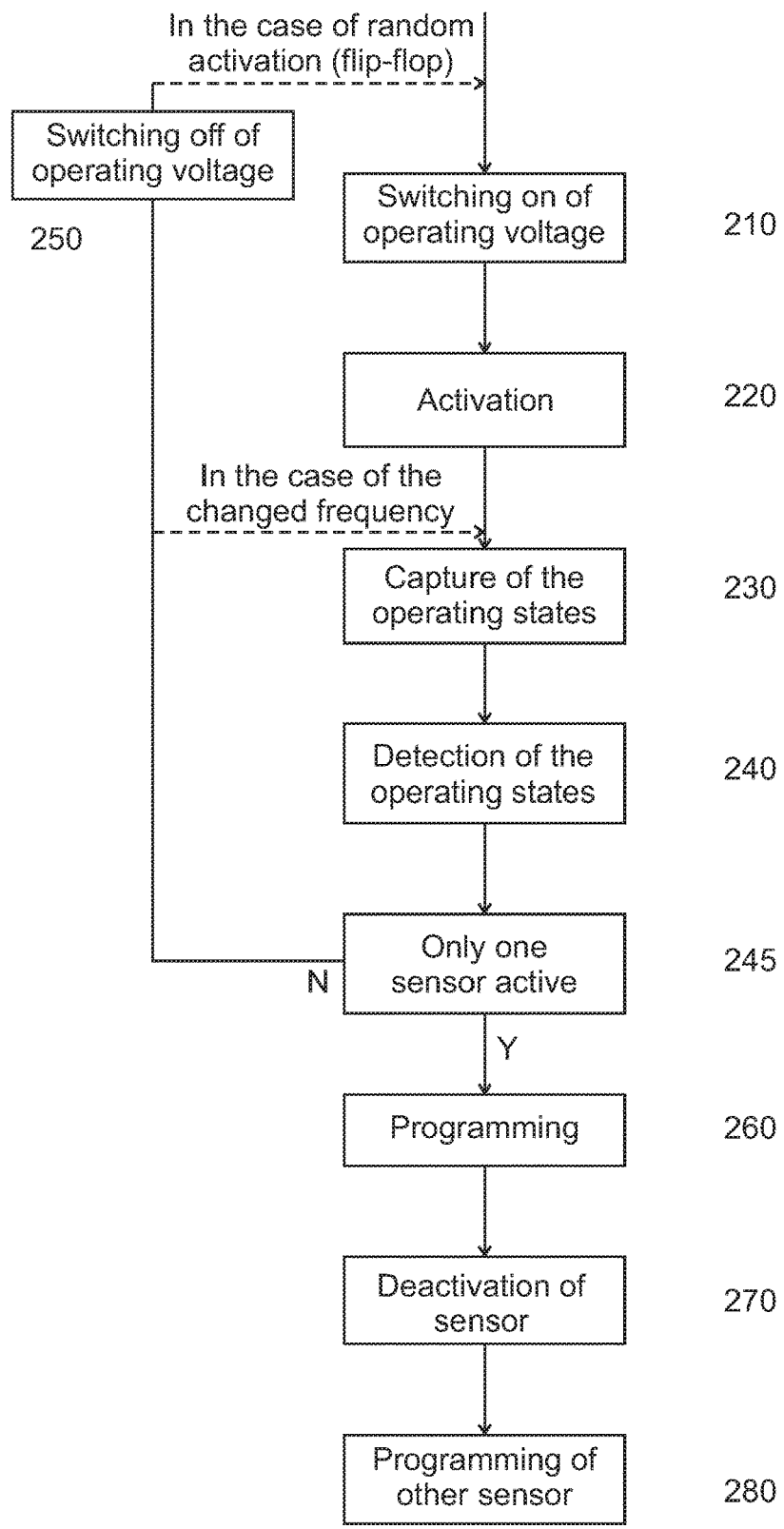
FIG. 2 the sequence of the method.

The method for programming the sensor units 20a, 20b is represented in FIG. 2. In a first step 210 the operating voltage for the sensor units is switched on via the supply lines Vdd/Vss. In a further step 220 one of the two sensor units 20a, 20b is selected for the programming and activated, as described in the following.

This selection with the activation can take place in the sensor unit 20a, 20b for example via a random generator with a flip-flop. In this case, the sensor units 20a or 20b are activated and set to readiness for receipt of programming commands for (re-)programming or set to the sleep mode.

In a different embodiment (cf. FIG. 3) the clock frequencies of the respective circuits are detuned. This detuning takes place through a change of the basic clock rate for the operation of the circuits by a random value, so that there exists at least one point in time at which only one of the circuits is active and thus ready to receive the programming commands.

The readiness for receipt of the circuits in the sensor units 20a, 20b is captured in the step 230 and in the step 240 is either measured on the basis of an increased current consumption of the two-wire sensor 10 or captured by detecting a current pulse. When one of the sensor units 20a, 20b is ready to receive, a normal current consumption is measured or a "normal" current pulse is detected. When both of the sensor units 20a, 20b are ready to receive, the double current consumption is measured and/or a "double" current pulse is detected. When no current is measured, it can be assumed that both sensor units 20a, 20b are in the sleep mode and are not ready to receive.

When a normal current consumption is measured and/or the normal current pulse is detected in the step 245, the sensor unit 20a or 20b can be programmed in the step 260, since it has to be assumed that the other sensor unit 20b or 20a is in the sleep mode. When no current consumption is measured, the operating voltage is switched off in the step 250 and subsequently both sensor units 20a and 20b are activated again and the method is repeated starting with the step 210. The current supply is switched off and the method is repeated starting with the step 210 also when a double current consumption is received or a double current pulse is detected in the step 245, since in this case both sensor units 20a, 20b are ready to receive, and a programming of one individual sensor unit 20a or 20b is not possible. The steps 210 to 245 can be repeated multiple times, until it is ensured that only one of the sensor units 20a or 20b is active.

The active sensor unit 20a or 20b is subsequently programmed in the step 260 by sending a programming command and is deactivated afterwards in the step 270. Subsequently, the method is repeated starting with the step 210 (in the case of activation via flip-flop) or starting with the step 230 (in the case of different clock frequencies), and the other sensor unit 20b or 20a is programmed in the step 280. When there are more than two sensor units 20a, 20b, the method can be repeated. As soon as all sensor units 20a, 20b have been programmed, the two-wire sensor 10 is operational.

Figure 3:
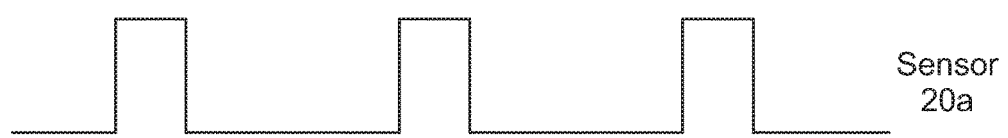
FIG. 3 the clock frequency.
Figure 3:

The second example of a command for activation of one of the sensor units 20a, 20b is represented in more detail in FIG. 3. Upon command, the random generator 40 generates a clock frequency with a suitable clock rate. From this clock rate (bottom) a second clock rate is produced with a suitable, long high phase and a longer low phase (top). Since the basic clock rate of the two sensor units 20a and 20b has been changed randomly, it has to be assumed that the two sensor units 20a and 20b run asynchronously to one another. Therefore, the case will occur with computable probability that a programming command will coincide with a high phase of only one of the sensor units 20a or 20b. The sensor unit 20a or 20b accepts the programming command via a programming signal from the programming logic only during this high phase and is reprogrammed only during this high phase. Subsequently the programmed sensor unit 20a or 20b is blocked. Afterwards, the other, not yet programmed sensor unit 20b or 20a can be programmed.

REFERENCE NUMERALS

250 Switching off of operating voltage
210 Switching on of operating voltage
220 Activation
230 Capture of the operating states
240 Detection of the operating states
245 Only one sensor active
260 Programming
270 Deactivation of sensor
280 Programming of other sensor

What is claimed is:

1. A method for programming a two-wire sensor having at least two sensor units, the method comprising the steps of:
   switching on the at least two sensor units;
   activating one of the at least two sensor units;
   capturing operating states of the at least two sensor units;
   detecting an operating state in which one individual sensor unit is active; and
   sending a programming command to the detected, active sensor unit.

2. The method according to claim 1, wherein the activation is caused by different clock frequencies on the at least two sensor units.

3. The method according to claim 2, wherein the different clock frequencies are produced by a random generator.

4. The method according to claim 1, wherein the activation is produced by a flip-flop.

5. The method according to claim 1, wherein the operating state of the sensor unit is captured on the basis of the current consumption of the sensor unit.

6. The method according to claim 1 further comprising programming the detected active sensor unit through the programming command.

7. The method according to claim 6, further comprising the switching off the detected, active sensor unit after the programming.

8. The method according to claim 6, further comprising the deactivation of the detected, active sensor unit after the programming.

9. The method according to claim 1 further comprising a repetition of the capture and detection of the operating state, so that a further sensor unit is programmed.

10. A two-wire sensor comprising:
    a first supply line and a second supply line;
    at least two sensor units which are connected in parallel between the first supply line and the second supply line, wherein the at least two sensor units comprise a programming logic which carries out a method for programming a two-wire sensor having at least two sensor units, comprising the steps of:
    switching on the at least two sensor units;

activating one of the at least two sensor units;
capturing operating states of the at least two sensor units;
detecting an operating state in which one individual sensor unit is active; and
sending a programming command to the detected, active sensor unit.

\* \* \* \* \*